United States Patent
Borremans et al.

(10) Patent No.: US 12,426,391 B2
(45) Date of Patent: Sep. 23, 2025

(54) HYPERSPECTRAL FILTER STRUCTURE AND METHOD OF MANUFACTURE

(71) Applicant: Spectricity, Mechelen (BE)

(72) Inventors: Jonathan Borremans, Lier (BE); Ruben Lieten, Heverlee (BE); Maarten De Bock, Ghent (BE); Ward van der Tempel, Keerbergen (BE)

(73) Assignee: Spectricity, Mechelen (BE)

( * ) Notice: Subject to any disclaimer, the term of this patent is extended or adjusted under 35 U.S.C. 154(b) by 614 days.

(21) Appl. No.: 17/657,793

(22) Filed: Apr. 4, 2022

(65) Prior Publication Data

US 2022/0352215 A1 Nov. 3, 2022

Related U.S. Application Data

(60) Provisional application No. 63/182,237, filed on Apr. 30, 2021.

(51) Int. Cl.
*H10F 39/00* (2025.01)
*G02B 5/28* (2006.01)

(52) U.S. Cl.
CPC .......... *H10F 39/805* (2025.01); *G02B 5/285* (2013.01); *H10F 39/024* (2025.01)

(58) Field of Classification Search
CPC .......... H01L 27/1462; H01L 27/14685; H01L 27/14621; H01L 27/14625; G02B 5/285; G01J 3/2823; G01J 3/12; G01J 2003/1213; H10F 39/805; H10F 39/024; H10F 39/8053; H10F 39/806
See application file for complete search history.

(56) References Cited

U.S. PATENT DOCUMENTS

| | | | |
|---|---|---|---|
| 2006/0014087 A1* | 1/2006 | Wittenberg | G02B 5/201 430/7 |
| 2016/0343757 A1* | 11/2016 | Enichlmair | H01L 27/14636 |
| 2018/0204863 A1* | 7/2018 | Tack | G01J 3/36 |
| 2020/0109991 A1* | 4/2020 | Tack | G01J 3/26 |
| 2020/0274036 A1* | 8/2020 | Le Blevennec | C09K 11/70 |

* cited by examiner

*Primary Examiner* — Moazzam Hossain
(74) *Attorney, Agent, or Firm* — Katz Ruby & Carle LLP; Kelly H. Hale

(57) ABSTRACT

A sensor system includes a plurality of optical sensors implemented in a pixel layer of an integrated circuit and a plurality of sets of optical filters implemented proximal to the pixel layer in a plurality of alternating filter layers. An optical filter of a set of optical filters includes a plurality of filter components implemented in a stack and is configured to pass a respective target wavelength range of light to one or more optical sensors of the plurality of optical sensors. One or more filter components of the plurality of filter components in a filter layer of the plurality of filter layers is common to a plurality of optical filters of a set of optical filters.

21 Claims, 12 Drawing Sheets

Figure 6:
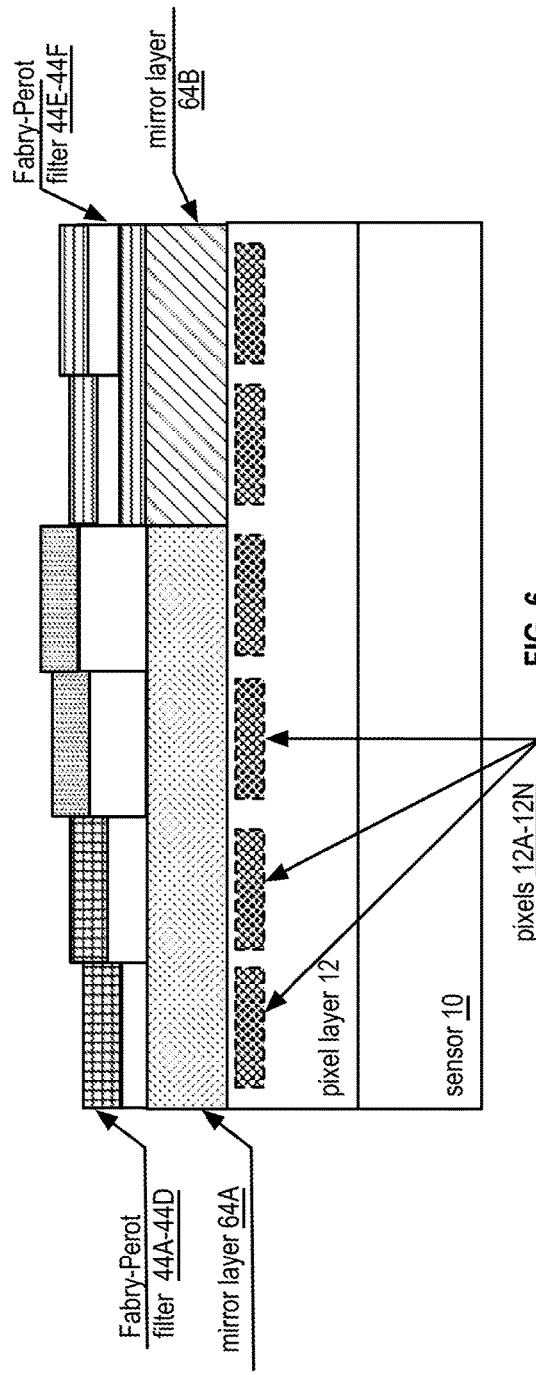

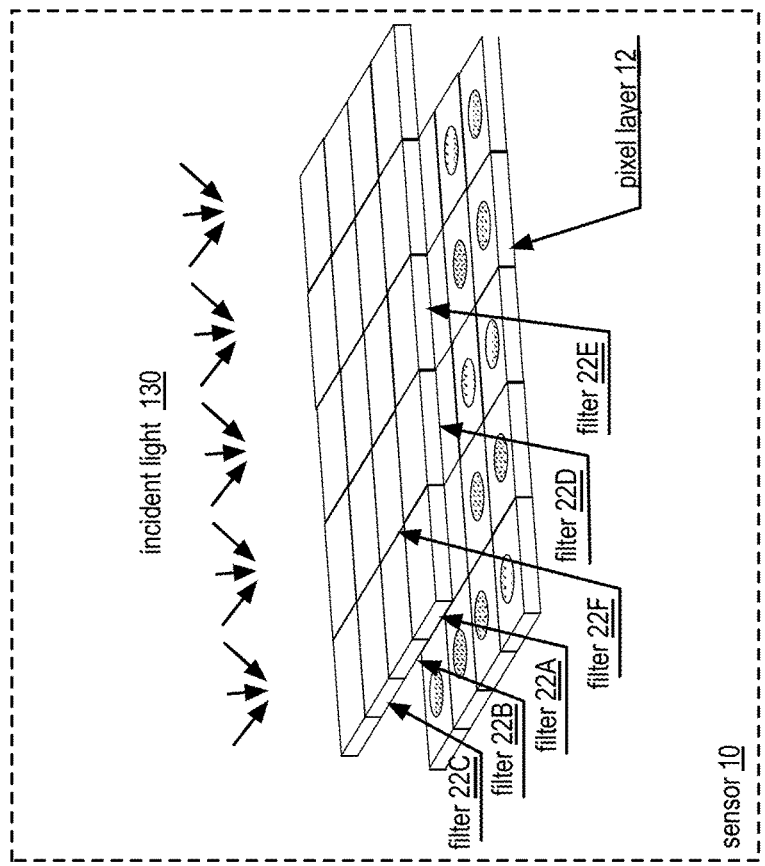
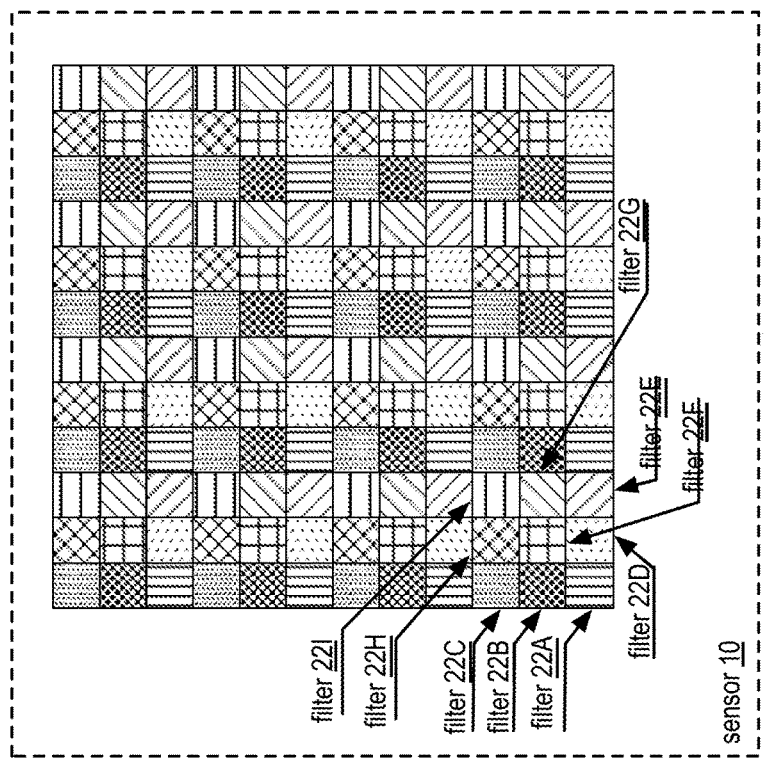
FIG. 1A
FIG. 1B

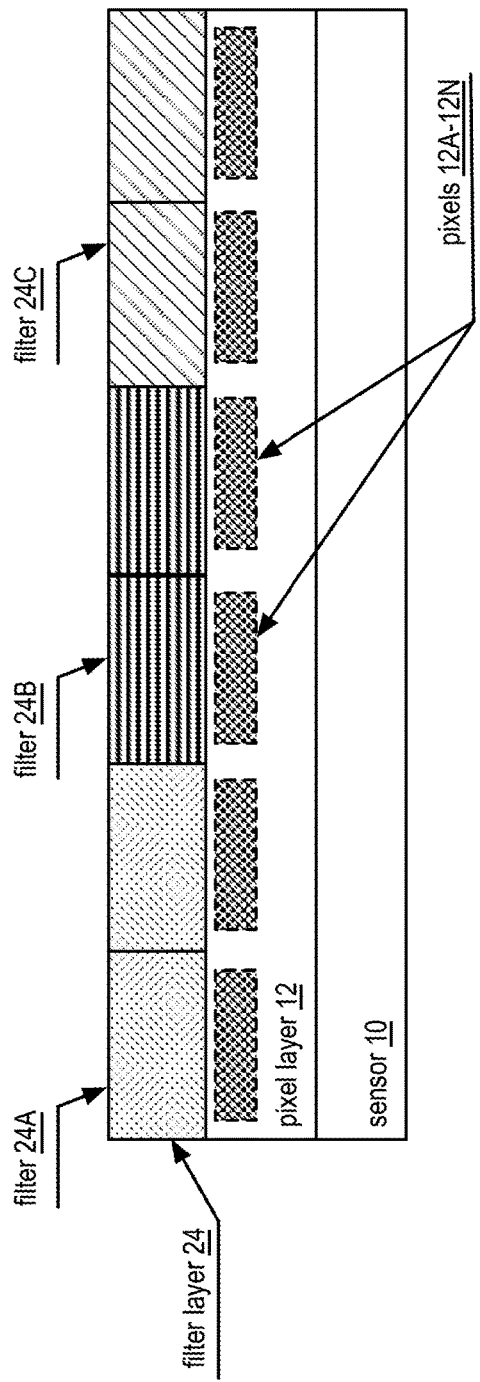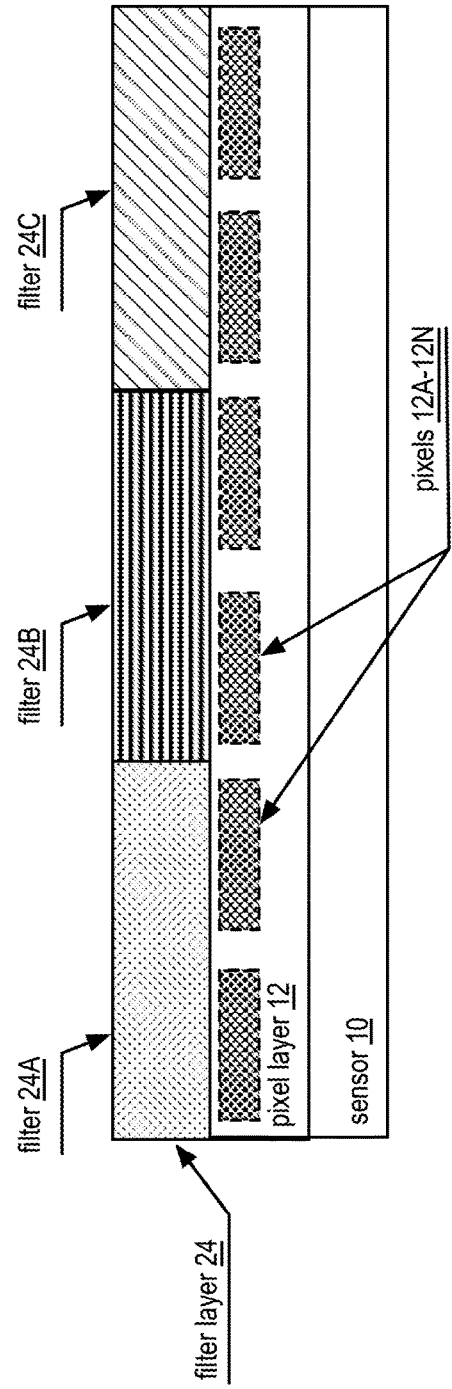

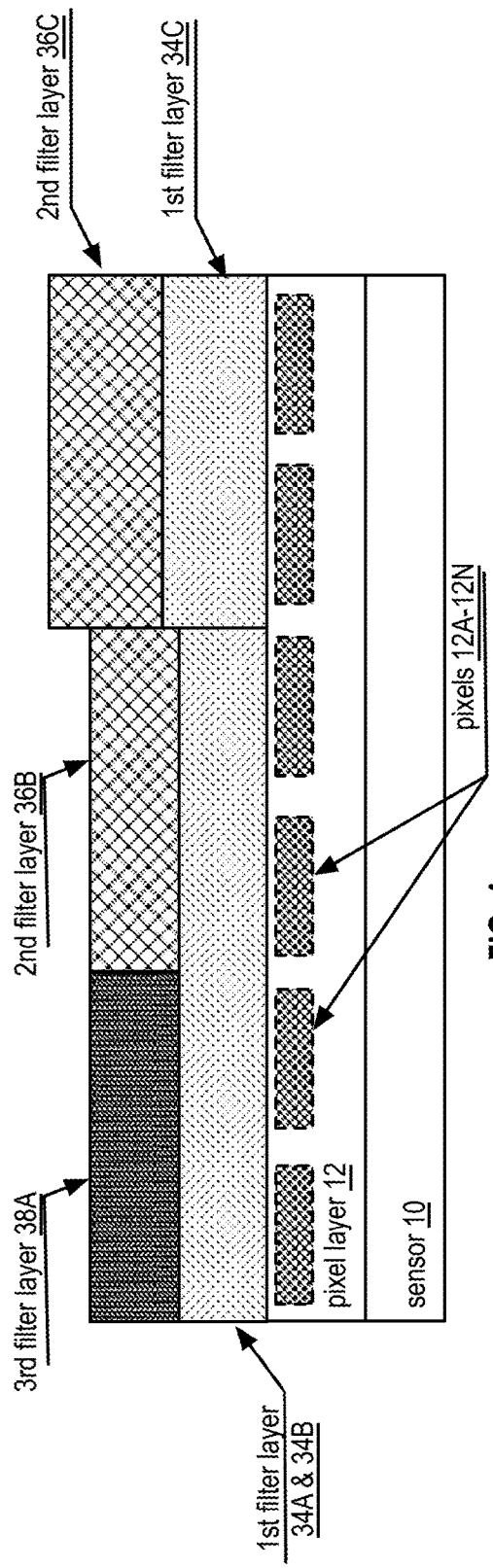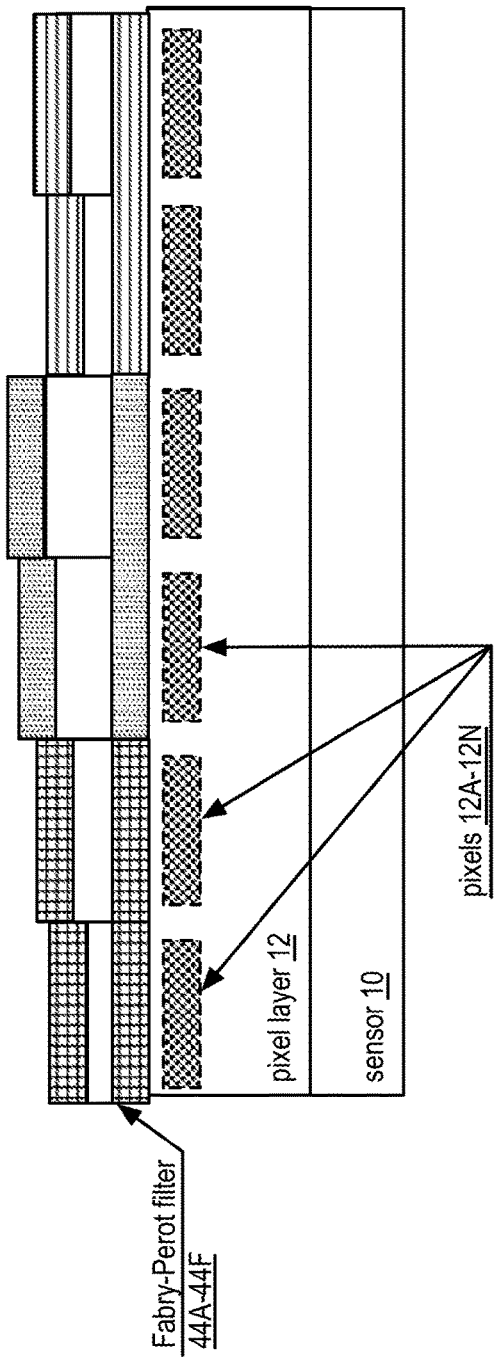

HYPERSPECTRAL FILTER STRUCTURE AND METHOD OF MANUFACTURE

The present U.S. Utility Patent application claims priority pursuant to 35 U.S.C. § 119(e) to U.S. Provisional Application No. 63/182,237, entitled "HYPERSPECTRAL FILTER STRUCTURE AND MANUFACTURE", filed Apr. 30, 2021, which is hereby incorporated herein by reference in its entirety and made part of the present U.S. Utility Patent Application for any and all purposes.

BACKGROUND OF THE INVENTION

Technical Field of the Invention

This invention relates generally to spectroscopy and more particularly to spectral sensors using interference-based filters.

Description of Related Art

Spectroscopy devices have proven to be useful for applications in various industries including, for example, health, biometrics, agriculture, chemistry and fitness. In general, spectroscopy devices function by detecting and/or acquiring incident light relating to multiple ranges of wavelengths and extracting spectral information. Interference-based filters, such as Fabry-Pérot filters, when used in conjunction with spectral sensors have been shown to be capable of providing controlled light wavelengths.

As is further known, interference-based filters can be applied to image sensors, such as CMOS image sensors, by providing additional manufacturing steps/processes.

BRIEF DESCRIPTION OF THE SEVERAL VIEWS OF THE DRAWING(S)

Figure 7:
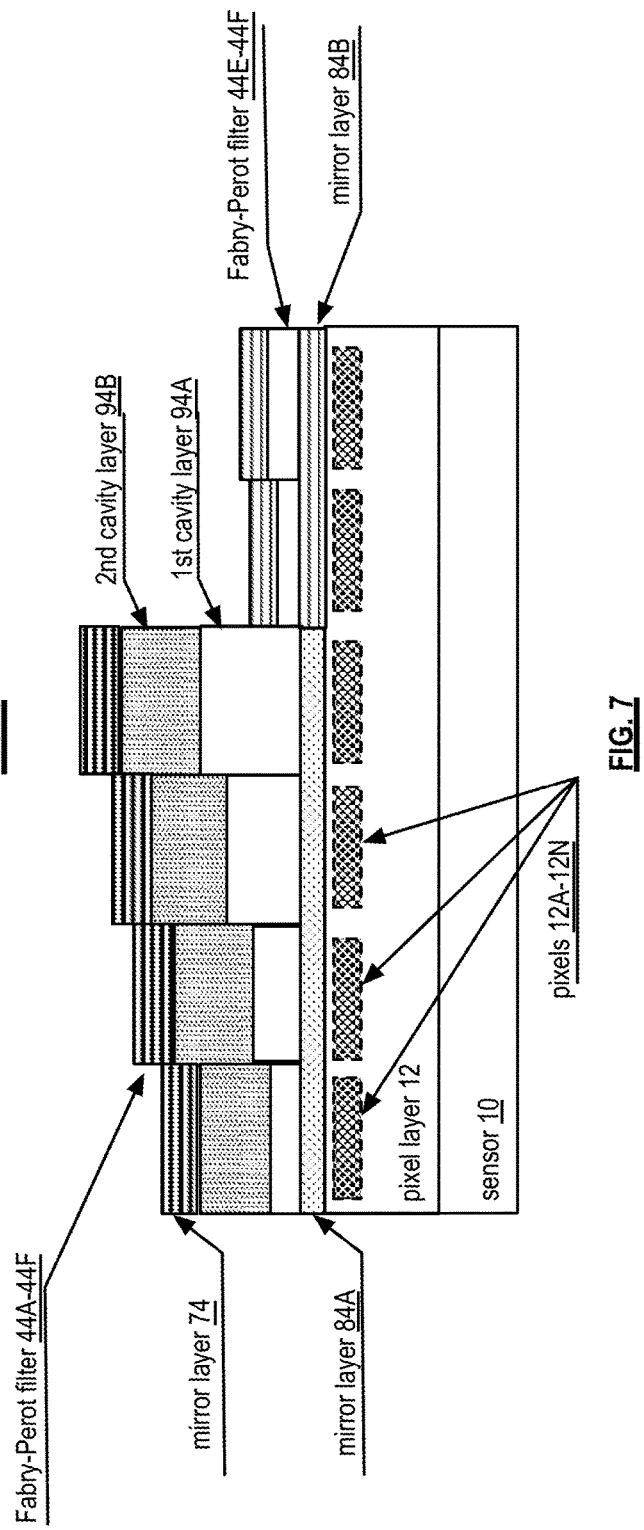
Figure 10:
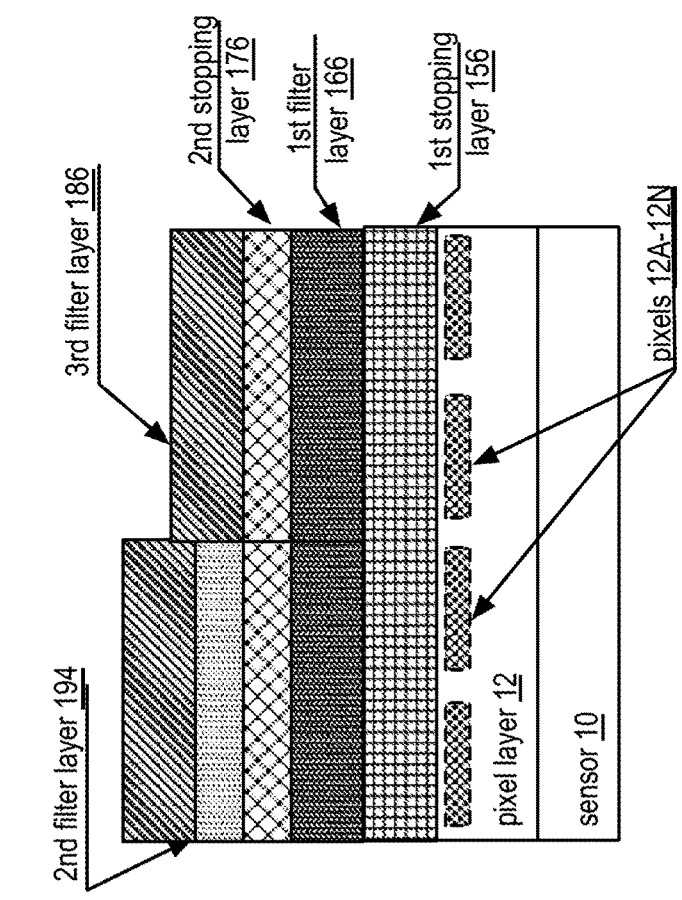
Figure 9:
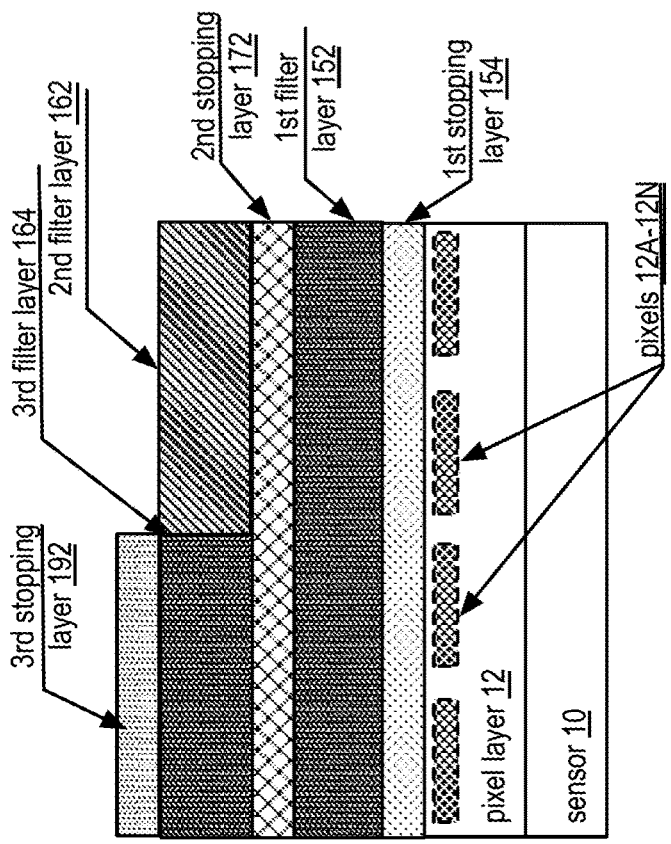
Figure 11B:
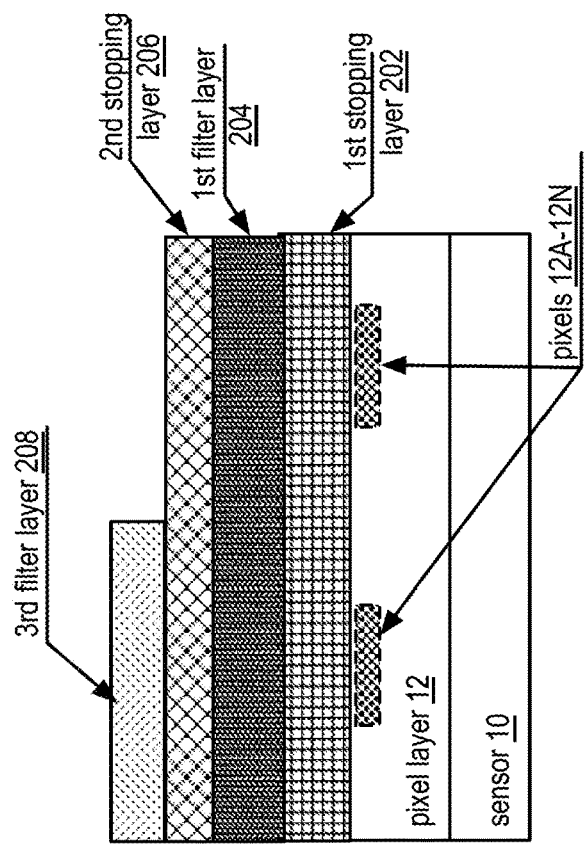
Figure 11A:
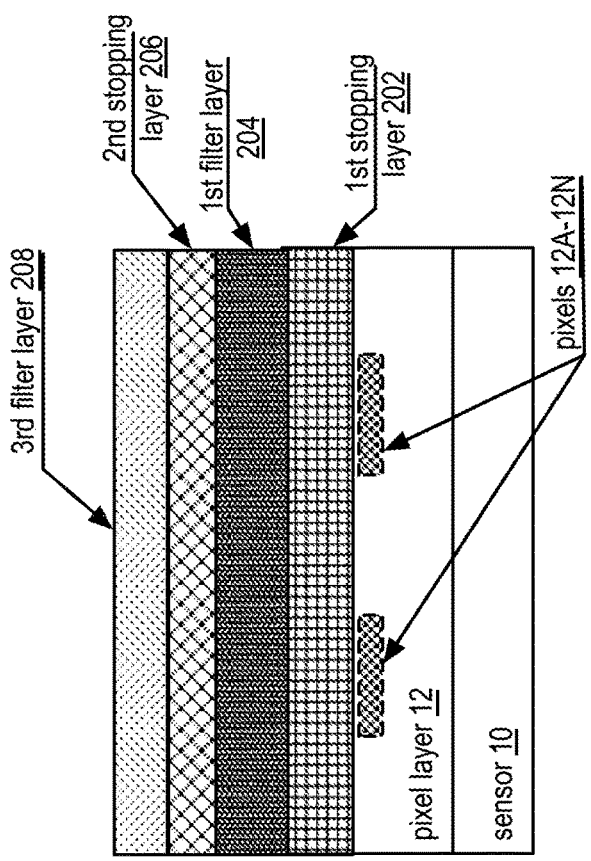
Figure 11C:
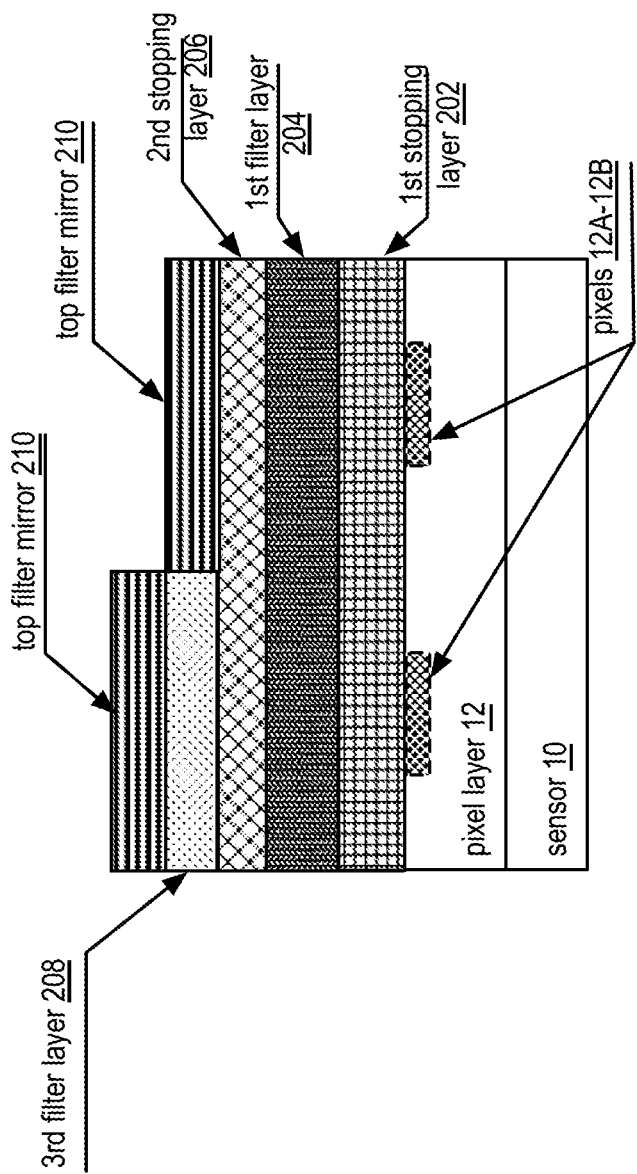
Figure 12A:
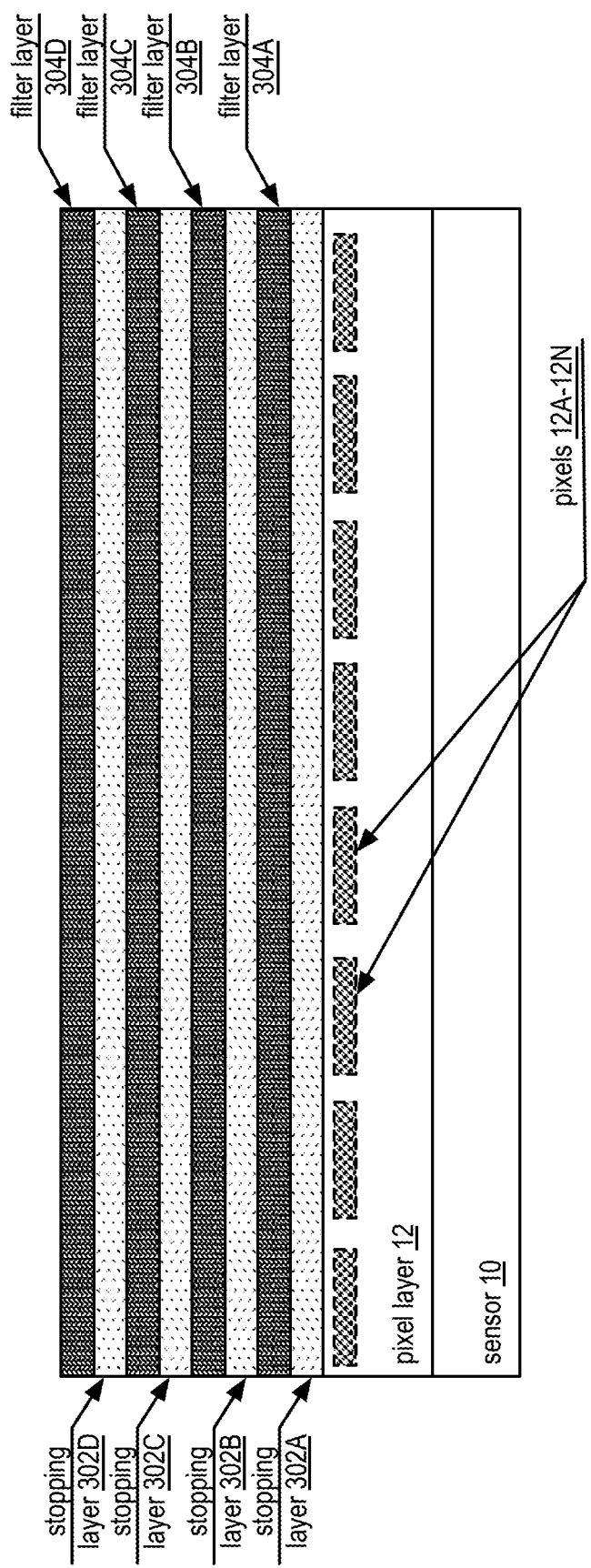
Figure 12C:
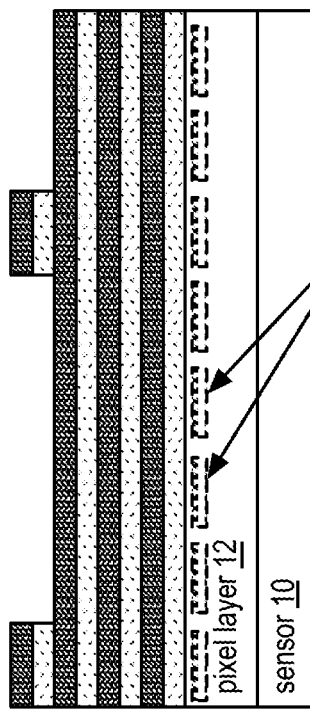
Figure 12E:
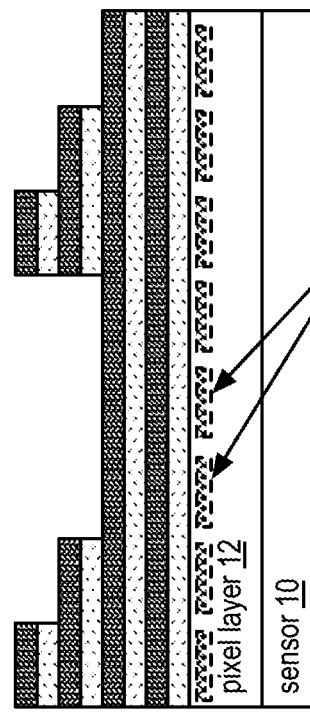
Figure 12B:
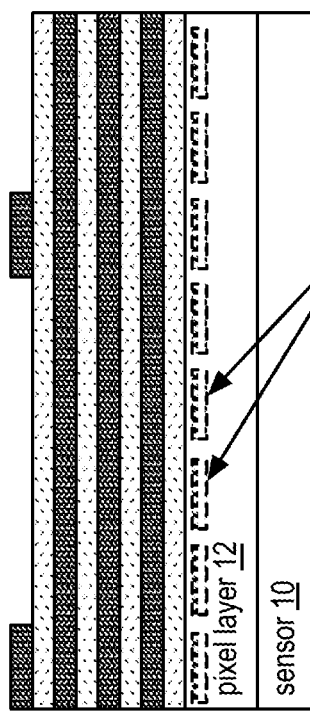
Figure 12D:
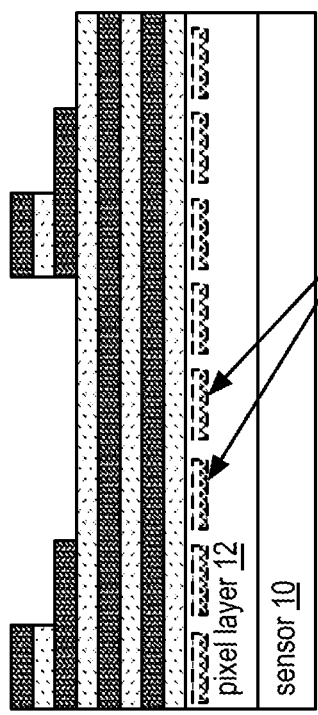
Figure 12F:
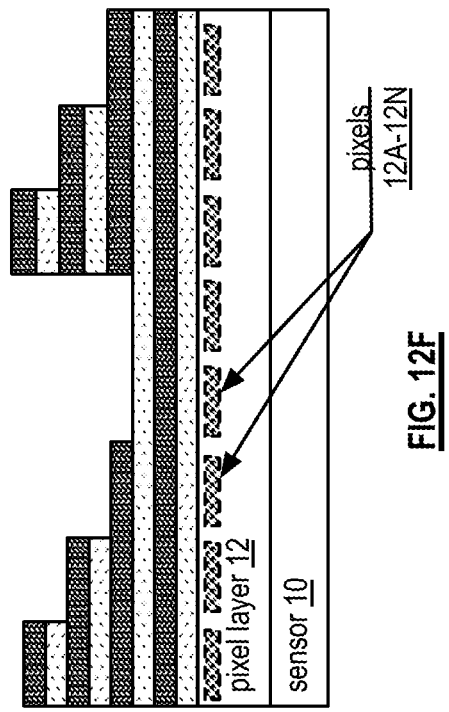
Figure 12G:
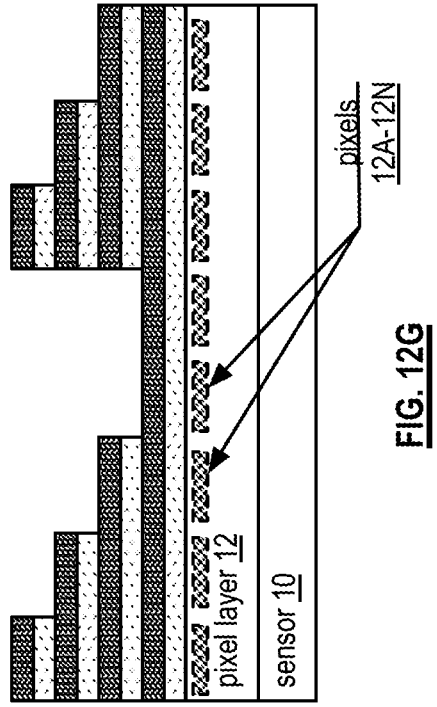
Figure 12H:
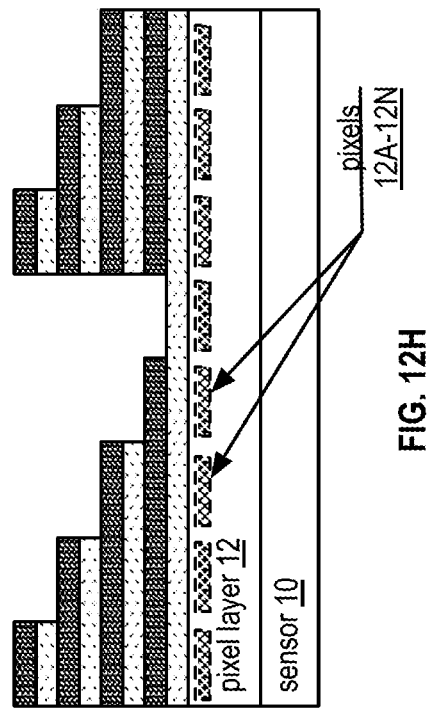
Figure 12I:
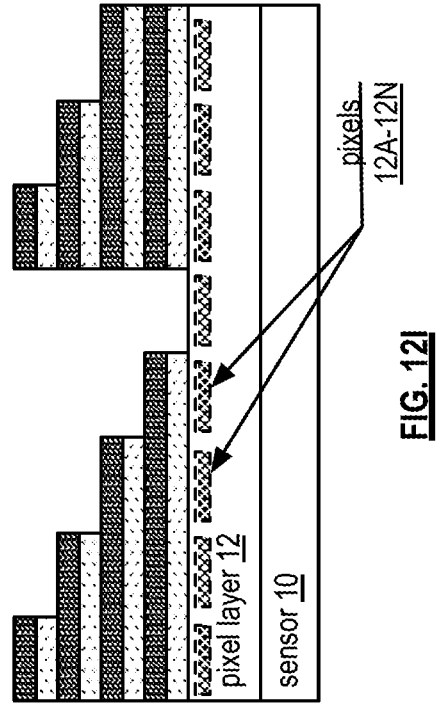
Figure 13:
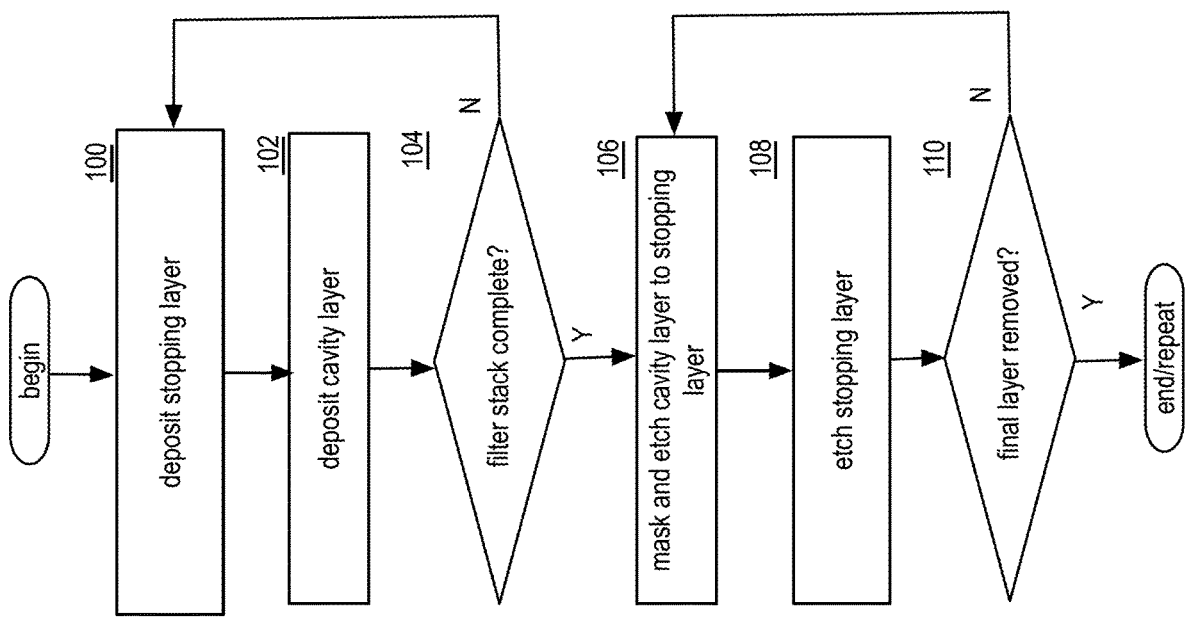

FIG. 1A provides a top-down representation of an example optical sensor overlaid with filters in accordance with the present invention;

FIG. 1B provides a perspective representation of an example optical sensor overlaid with filters in accordance with the present invention;

FIG. 2 provides a cross-section of adjacent interference filters overlaying an image sensor in accordance with the present invention;

FIG. 3 provides an example cross-section of adjacent interference filters overlaying the pixel layer of an image sensor in accordance with the present invention;

FIG. 4 provides another example cross-section of adjacent interference filters overlaying the pixel layer of an image sensor in accordance with the present invention;

FIG. 5 provides an example cross-section of adjacent Fabry-Pérot interference filters overlaying the pixel layer of an image sensor in accordance with the present invention;

FIG. 6 provides another example cross-section of adjacent Fabry-Pérot interference filters overlaying the pixel layer of an image sensor in accordance with the present invention;

FIG. 7 provides another example cross-section of adjacent Fabry-Pérot interference filters overlaying the pixel layer of an image sensor in accordance with the present invention;

FIGS. 8A-8D provide example cross-sections illustrating the formation of adjacent interference filters using an etch stop in accordance with the present invention;

FIG. 9 provides another example cross-section of adjacent Fabry-Pérot interference filters overlaying the pixel layer of an image sensor in accordance with the present invention;

FIG. 10 provides another example cross-section of adjacent Fabry-Pérot interference filters overlaying the pixel layer of an image sensor in accordance with the present invention;

FIGS. 11A-11C provide example cross-sections illustrating the formation of an interference filter structure using an etch stop combined with patterned etch process in accordance with the present invention;

FIGS. 12A-12I provide example cross-sections illustrating a multi-layer interference filter structure using stoppings layers combined with patterned etch processes in accordance with the present invention; and FIG. 13 is a is a flowchart of a method for manufacturing multi-layer interference filter structure using stoppings layers combined with patterned etch processes in accordance with the present invention.

DETAILED DESCRIPTION OF THE INVENTION

In various examples, image sensors are combined with interference filters to provide spectral image sensors, such as hyperspectral image sensors. In further examples, interference filters can be implemented using Fabry-Pérot filters integrated with image sensors, such as CMOS image sensors, to provide small-scale spectral image sensor systems. In an example, interference filters can be added using post manufacturing processes on image CMOS sensors, where the interference filters comprise alternating layers providing different refractive indices. In some examples, interference filters may be based on a Fabry-Pérot designs to provide substantially narrowband filter responses, where the Fabry-Pérot designs includes Bragg mirrors, separated by a cavity layer.

In certain examples, optical filters can comprise rejection filters for removing light wavelengths outside of a desired and/or valid range of the Fabry-Pérot mirror filter layers. In other examples, optical filters can comprise Fabry-Pérot interferometers configured as a pair of partially reflective glass optical flats spaced apart requiring multiple deposition and lithography steps. In a related example, all or a portion of Fabry-Pérot interferometers are configured as multiple pairs of partially reflective glass optical flats, with partially reflective surfaces facing each other in a stack. In an example, the performance of interference filters, including the spectral response performance of the interference filters, depends on various properties of interference filter layers, including, but not limited to the thickness (including thickness uniformity, accuracy of the layer deposition and precision of the layer deposition), composition and density of the interference filter layers.

FIG. 1A provides a top-down representation of an example image sensor overlaid with interference filters. In an example, the interference filters may be patterned across an image sensor by provisioning interference filters adapted for different wavelengths over groups (or sets) of pixels or optical sensor elements. In a specific example, a "pixelated sensor" can be provided in this manner, where the pixelated sensor include different pixels provisioned with filters adapted to pass different portions according to a spectrum of light wavelengths. In another example, sets of pixels overlayed with interference filters adapted for different wavelengths can be repeated over the spatial area of an image sensor.

In an example image sensor based on FIG. 1A, pixels for image sensor 10 are disposed on an integrated circuit with a plurality of sets of interference filters manufactured on top of the optical pixels. In the specific example of FIG. 1A, multiple sets of nine (9) interference filters 20A-20I are arranged in mosaic patterns, each configured to pass light in a different wavelength range. In an example, each set of interference filters is aligned to at least a set of optical sensors elements (pixels), such that each set of pixels can together sense a localized bandpass response with 9 channels. In a specific example, the set of pixels and associated filter mosaic can then be repeated across a larger array, enabling the optical sensor array to provide multiple measured light spectra spatially separated across different areas of an optical sensor. As used herein, an individual optical sensor element corresponds to a pixel (pixel=smallest addressable element), where a pixel can be, for example, a photodiode. Accordingly, "optical sensor element", "optical pixel" and "pixel" are used interchangeably.

FIG. 1B provides a perspective representation of an example image sensor overlaid with filters, such as sensor 10 from FIG. 1A. In the example, incident light 130 is filtered using filters, such as the filter mosaic comprised of filters 22A-22E, before being collected at pixel layer 12. In the example of FIG. 1B, each filter is associated with a single pixel, so that an image generated by sensor 10 can include localized spectra for the image. In another example, the 1-to-1 relationship of FIG. 1B can be altered such that a single pixel is associated with more than one filter or, alternatively, a single filter can be associated with multiple pixels. In another example, filter mosaics, such as the filter mosaic comprised of filters 22A-22E, can be noncontiguous over the surface of pixel layer 12, providing for spectral collection for less than the full surface of pixel layer 12.

FIG. 2 provides a cross-section of adjacent optical filters overlaying an image sensor 10. As illustrated, the center wavelengths of optical filters 24A, 24B and 24C are determined in a first order by the cavity thickness between an upper and lower mirror. In an example, adjacent filters in a filter mosaic provide 6 channels of sensor output based on pixels 12A-12N of pixel layer 12. In another example, a filter mosaic can provide any number of channels, limited only by the manufacturing requirements and sensor sensitivity requirements.

In an example, filter layers may be deposited using a variety of deposition techniques, including, but not limited to, gas phase deposition (such as chemical vapor deposition (CVD)), single layer deposition, spin-on processes (such as spin-on glass), e-beam deposition, and sputter processes. Example sputter processes include ion-beam sputtering, reactive sputtering, high-target-utilization sputtering, ion-assisted deposition, high-power impulse magnetron sputtering and gas flow sputtering, while single layer deposition techniques include molecular beam epitaxy (MBE), the Langmuir-Blodgett method, atomic layer deposition and molecular layer deposition.

Filter layer material, either in whole or in-part, can be selectively removed by, for example, using a lift-off process or an etch process, where the filter is removed from areas defined using various lithographic processes. In an example, an inverse pattern can be provided in a sacrificial layer (such as photoresist) that has been deposited on a substrate. In an example, the sacrificial layer can be applied on the surface of a filter layer or pixel layer using, for example, a spin-on process. In an example, the inverse pattern can be created by etching openings through openings in the sacrificial layer so that etchant (wet chemicals, reactive gases, accelerated ions, etc.) can reach the surface of the substrate in those regions where the filter layer material is to be removed. In an example, a filter layer material can be deposited over the entirety of a wafer comprising a plurality of completed pixel arrays, with photo-defined openings allowing etchant to reach the surface of the substrate in what will be etched regions, while being resisted by the sacrificial layer in the areas where it was not previously etched. In an example of implementation, when a sacrificial layer is removed using an etching or solvent removal process, the filter layer material on top of the sacrificial layer is lifted-off and removed, together with the sacrificial layer below. In an alternative example, after a lift-off process, filter layer material remains only in areas where it has a direct contact with the substrate. In yet another alternate example, filter material can be removed from lithographically defined areas using an etch process, such as reactive-ion etching (ME), ion milling, plasma etching and wet chemical etching, either alone or in combination.

In some examples, filter structures can be constructed with different required filters being manufactured one by one, where the filter material is deposited on the entire substrate and then fully removed from certain areas, with other filters eventually being deposited in those areas. FIG. 3 provides an example cross-section of adjacent interference filters 24A-24C overlaying the pixel layer of an image sensor 10. In the example, each of the filters 24A-24C are manufactured using discrete processing steps to build up a desired filter structure over a plurality of pass-through wavelengths for collection at pixel layer 12.

FIG. 4 provides another example cross-section of adjacent interference filters overlaying the pixel layer of an image sensor. In the example, one or more filter layers, such as the $1^{st}$ filter layer, is deposited on a substrate, with filter material ($1^{st}$ filter layer 34A and 34B) common to a plurality of filter wavelengths retained on the substrate of sensor 10. In the example, only that portion of the filter material comprising $1^{st}$ filter layers 34A-34C that is not common to a subset of filters is removed. Said another way, a set of filter layers is not removed when those filter layers are common to several of the filters on the sensor, with other filter layers, such as the filter layers for $2^{nd}$ filter layer 36B and 36C being deposited on different areas of the filters. In the example, a filter material comprising a portion of filters overlaying pixel layer 12 includes a first portion of filter material common to other filters in a filter array, along with a second portion and/or a third portion (such as filter layer 38A) defined and deposited to provide a desired filter response for different optical filters.

FIG. 5 provides an example cross-section of adjacent Fabry-Pérot interference filters 44A-44F overlaying the pixel layer 12 of an image sensor 10. In the example, the bottom part of a Fabry-Pérot filter comprising, for example, a partially reflective glass optical flat located above the pixel layer of an image sensor, is deposited, along with a cavity layer. In an example, the cavity layer is selectively removed (for example in a binary process) on some of the areas of the sensor to define different cavity thicknesses. In an example, different Fabry-Pérot filter types with different center wavelengths are created with the bottom part of different filters being deposited and defined in a same step.

FIG. 6 provides another example cross-section of adjacent Fabry-Pérot interference filters overlaying the pixel layer of an image sensor. In the example a first portion, in the example mirror layer 64, directly overlays pixel layer 12 of image sensor 10 and is common to a plurality of different Fabry-Pérot filters 44A-44D, while mirror layer 64B is common to Fabry-Pérot filters 44E and 44F. In a related example, the first portion can be adapted to reject light wavelengths outside of a desired and/or valid range. In an example, a top mirror layer, such as mirror layer 74 from FIG. 7, below, can be common to a plurality of different Fabry-Pérot filters 44A-44B as well, for most or all of the Fabry-Pérot filters of a desired filter mosaic.

FIG. 7 provides another example cross-section of adjacent Fabry-Pérot interference filters overlaying pixel layer 12 of an image sensor 10. In the example, a first filter layer, such as mirror layer 84A or mirror layer 84B is common to a plurality of different Fabry-Pérot interference filters, such as, respectively, Fabry-Pérot filters 44A-44D or Fabry-Pérot filters 44A-44B. In an example, the first filter layer can be adapted to reject light wavelengths outside of a desired and/or valid range. In a specific example, the first filter layer can itself comprise multiple sub-layers, such as a layer of partially reflective material and a layer adapted to provide etch selectivity. In a specific example of implementation, common cavity layers, such as $1^{st}$ cavity layer 94A and/or $2^{nd}$ cavity layer 94B of different Fabry-Pérot interference filters, can be deposited and/or defined at the same time for Fabry-Pérot designs that include more than two Bragg mirrors. In yet another specific example, Fabry-Pérot filters can include various combinations of cavity layers, mirror layers, and etch stops (stopping layers) configured so that common layers are shared between interference filters in a set of interference layers where each interference filter is associated with different target wavelengths.

FIGS. 8A-8D provide example cross-sections illustrating the formation of adjacent interference filters using an etch stop (stopping layer). As discussed above, the spectral responses of spectral filters on an image sensor are substantially defined by the thicknesses of the different spectral filter layers. In an example, the efficiency/effectiveness of various etch processes, such as those discussed above, can be dependent on the chemical properties of a given material subjected to the etch process(es). For example, some etch processes produce an isotropic etch profile, because they erode a substrate substantially equally in all directions. Other etch processes produce various approximations of an anisotropic profile, because they etch selectively (at least to some extent) in one direction. In a specific example, an etch process or etchant can be adapted to etch effectively in some materials while other materials are effectively inert to that etch process or etchant. When etching a set of interference filter layers, a substantially inert material can be used to provide a landing layer (etch stop) for the etching chemistry and process, facilitating control of the etching process to a reasonably controllable/accurate depth.

Figure 8A:
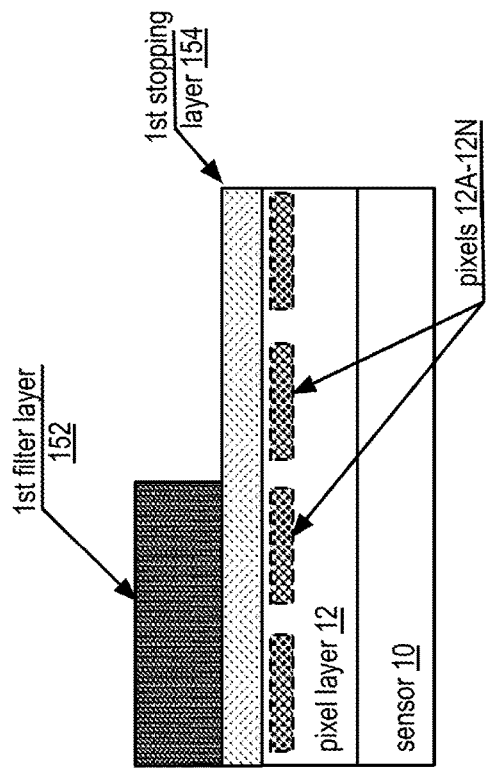

In the example of FIG. 8A, a $1^{st}$ stopping layer 154 is deposited over pixel layer 12 of sensor 10, followed by the deposition of a $1^{st}$ filter layer 152 over $1^{st}$ stopping layer 154. In the example, $1^{st}$ filter layer 152 (and subsequent filter layers comprises a cavity layer for an interference filter, whereas stopping layer 154 can be considered another filter layer, since it can be a component of a finished filter, even though it is not labeled as such for purposes of clarity. As discussed with reference to FIG. 7, the $1^{st}$ stopping layer 154 can comprise multiple sub-layers adapted for reflectivity performance and/or layers adapted for resistance to various etch processes. In another example, the $1^{st}$ filter layer 152 can comprise multiple sub-layers adapted for optical performance, such as layers having desired refractive index or the sub-layers can be adapted to increase manufacturing efficiency by allowing $1^{st}$ filter layer 152 to be deposited and processed for shared use in multiple interference filters that comprise a set of interference layers, with each interference filter being associated with different target wavelengths.

In an example, an etch stop, such as $1^{st}$ stopping layer 154, can be used as a component of an etching process so that a desired layer thickness accuracy can be achieved. In a specific example, an etch stop layer, such as $1^{st}$ stopping layer 154, can be used as an interference filter layer, either as the interference filter layer itself or as one of the layers that comprise the interference filter layer. For example, the first layer of an interference layer can be adapted to provide an etch stop, so that an etch process terminates on the stopping layer, such as $1^{st}$ stopping layer 154.

In various related examples of implementation and operation, an etch stop layer, such as $1^{st}$ stopping layer 154, is part of the optical filter design. In other examples an etch stop layer, such as $1^{st}$ stopping layer 154, is removed with another etching step. In an example, interference filter materials (such as interference cavity and/or mirrors in a Fabry-Pérot filter stack) can include at least one of silicon oxide ($SiO_x$), titanium oxide ($TiO_x$) and niobium oxide $Nb_xO_y$.

In a specific example, the formation of a cavity layer between mirror layers, such as filter layer 152 in FIG. 8A, can be controlled by adding carbon gas at specific steps of cavity deposition. In another example, the carbon gas can be used to provide for a selective etch stop layer for selective wet chemical etching. In another specific example, an etch stop layer, such as $1^{st}$ stopping layer 154, comprises a set of different material layers. In yet another example, the stopping layer, such as $1^{st}$ stopping layer 154, comprises one or more sacrificial layers. In another specific example, an etch stop layer, such as $1^{st}$ stopping layer 154, is utilized in a process that includes a combination of different etch steps. Etch steps in an associated etch process can include one or more time-based etches, one or more selective etches or a combination thereof.

In a specific example of implementation and operation, one or more etch stop layers, such as $1^{st}$ stopping layer 154, can be used in spatially separated locations in a set of interference filter. In a specific example, cavity layers of an interference filter layer can be provisioned on the top, on the bottom, or in the middle of a filter stack using an etch stop layer, such as $1^{st}$ stopping layer 154. In another example, an etch stop layer or layers, such as $1^{st}$ stopping layer 154, are included in the design optimization of a spectral filter. In yet another specific example, an etch stop layer, such as $1^{st}$ stopping layer 154, can be removed using an etch process and then reapplied with a deposition step.

Figure 8B:
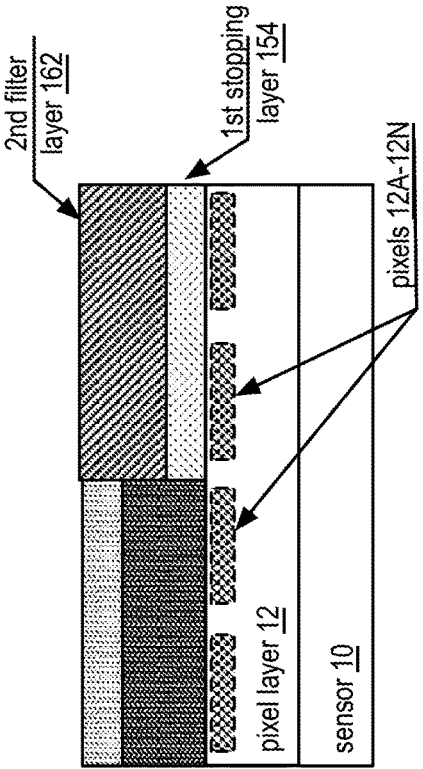
Figure 8C:
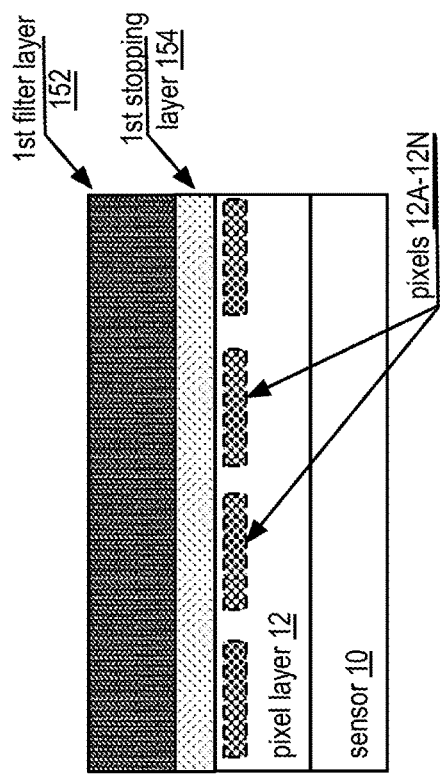
Figure 8D:
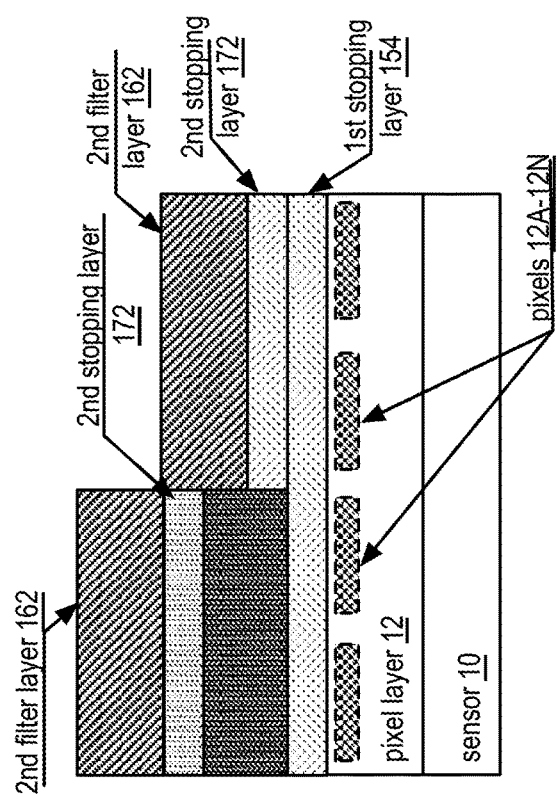

Referring again to FIG. 8A, $1^{st}$ stopping layer 154 and $1^{st}$ filter layer 152 are first deposited on pixel layer 12 of sensor 10. In FIG. 8B, $1^{st}$ filter layer 152 is selectively etched (removed) from a first area of sensor 10, with the etch process effectively stopping at $1^{st}$ stopping layer 154. In FIG. 8C, a $2^{nd}$ etch stop layer, $2^{nd}$ stopping layer 172, and a $2^{nd}$ filter layer 162 are deposited on $1^{st}$ filter layer 152 where it remains and on $1^{st}$ filter layer 152 where the $2^{nd}$ stopping layer 172 has been removed. In FIG. 8D, $2^{nd}$ filter layer 162 is selectively etched (removed) from a $2^{nd}$ area of sensor 10, with the etch process being substantially stopped at $2^{nd}$ stopping layer 172. In an example related to FIGS. 8A-8D, a stopping layer, such as $1^{st}$ stopping layer 154 and/or $2^{nd}$ stopping layer 172 can adapted to provide one or more partially reflective mirrors in a Fabry-Pérot filter stack. In another example, an etch process can be adapted to remove a mirror layer, such as $1^{st}$ filter layer 152 or $2^{nd}$ filter layer 162 in a lithographic process adapted for placing partially reflective mirrors in various positions in a stack of filter elements.

FIG. 9 provides another example cross-section of adjacent Fabry-Pérot interference filters overlaying pixel layer 12 of an image sensor 10. In the example, common filter layers $1^{st}$ stopping layer 154, $1^{st}$ filter layer 152 and $2^{nd}$ stopping layer 172 are common to two optical filters. In an example, $2^{nd}$ filter layer 162, $3^{rd}$ filter layer 164 and $3^{rd}$ stopping layer 192 are then provisioned using a series of deposition and lithographic processes, such as the processes discussed in any of the various examples from the Figures included herein.

FIG. 10 provides another example cross-section of adjacent Fabry-Pérot interference filters overlaying pixel layer 12 of an image sensor 10. In the example, $2^{nd}$ filter layer 194 is deposited over $2^{nd}$ stopping layer 176 and removed from one of the filter stacks in an etch process using $2^{nd}$ stopping layer 176. In the example, $3^{rd}$ filter layer 186 is then deposited over both filter stacks, providing a larger cavity depth for the filter where $2^{nd}$ filter layer 194 remains. In an example, a Fabry-Pérot filter design can be adapted for increased cavity depth using this or a similar process. In an example, an etch process can be substantially stopped by a stopping layer, so that additional cavity material can be added to provide a cavity comprising a first cavity layer and a second cavity layer on some of the optical filters in a set of optical filters.

FIGS. 11A-11C provide example cross-sections illustrating representative steps in the formation of an interference filter structure using an etch stop combined with patterned etch process. In FIG. 11A, a Fabry-Pérot mirror and cavity is formed using a $1^{st}$ stopping layer 202, $1^{st}$ filter layer 204 and $2^{nd}$ stopping layer 206. In FIG. 11B a $3^{rd}$ filter layer 208 is then deposited and selectively etched (removed) from one of the two adjacent optical filters using a patterned etch process that is effectively stopped by the $2^{nd}$ stopping layer 206. In FIG. 11C, top filter mirror 210 is deposited over both of the filter stacks, providing a larger cavity depth for the filter where $3^{rd}$ filter layer 208 remains. In an example, a pair of Fabry-Pérot filters can be provided by sharing lower filter layers and differentiated at top filter layers by using an intermediate etch stop, such as $2^{nd}$ stopping layer 206.

FIGS. 12A-12I provide example cross-sections illustrating a multi-layer interference filter structure using stoppings layers combined with patterned etch processes. In FIG. 12A, stopping layer 302A is deposited on pixel layer 12 of sensor 10, with filter layer 304A then deposited directly on top of stopping layer 302A. In this manner, filter layers 304A-304C are sandwiched between stopping layers 302A-302D respectively, with filter layer 304D then deposited over the resultant filter "sandwich". In an example, each of stopping layers 302A-302D and/or filter layers 304A-304D can be comprised of multiple sub-layers, as appropriate, to provide desired etch selectivity, refractive performance and reflectivity. In another example, different filter layers 304A-304D can be configured with varying thicknesses and/or refractive indices for use as, for example, cavity structures in Fabry-Pérot filters.

In a specific example of implementation, stopping layers 302A-302D can provide various light reflectivity and/or light rejection functions. In yet another example, multiple sub-layers for each of stopping layers 302A-302D can include varying reflective layers and/or layers adapted for selectivity to etch processes. In another specific example of implementation, sub-layers for each of 304A-304D can be adapted to comprise varying thicknesses and/or materials of varying refractivity. In a related example, refractive indices and reflectivity for various sub-layers for stopping layers 302A-302D and filter layers 304A-304D can be accounted for in the design of a spectral sensor to maintain desirable optical performance. In an example, an automated design tool can be used to provide for efficient processing requirements while accommodating and maintaining filtering performance.

In FIG. 12B a lithographic process is used to remove filter layer 304 from select areas of sensor 10 using stopping layer 302D to protect areas where filter layer 304 is removed. In FIG. 12C the stopping layer is then removed from the same areas by, for example, using a selective etch process adapted for selectivity to filter layer 304C. In FIG. 12C another lithographic process is used to remove filter 304C from select areas of sensor 10. FIGS. 12D through 12I illustrate the selective removal of stopping layers 302C-302A and filter layers 304B and 304A in a similar manner. In a specific example, the filter layers and stopping layers can be adapted to accommodate different etch processes depending on filter structure. For example, a mixed approach can be used, where an isotropic etch, such as a wet chemical etch, can be used to etch thin filter (cavity) layers, where the isotropic etch characteristics will not significantly erode laterally into adjacent filter elements. In the example, more anisotropic etch processes can be used for thicker filter (cavity) elements, such that the formation of a set of filters of different target wavelengths can include multiple etch processes selected for performance and economy of time and materials.

While the FIGS. 12A-12I illustrate a substantially linear progression of adjacent filters from thick to thin, in practice the relationship between filters designed for different target wavelengths can be altered so that filters with close target wavelengths can be spatially separated within a mosaic of filters. For example, in order to minimize various chemical effects, physical effects and/or optical requirements for different target wavelengths, a single filter stack can be configured to be adjacent to a filter stack with a larger number of filter elements, limited only by process and design constraints.

FIG. 13 is a flowchart of a method for manufacturing multi-layer interference filter structure using stoppings layers combined with patterned etch processes. The method begins by depositing a stopping layer on an optical sensor, such as an array of pixels at step 100. The method then continues at step 102 by depositing a filter layer over the stopping layer. At step 104, when the stack of filter elements is not complete, steps 100 and 102 are repeated until the desired filter stack is complete. When the filter stack has the desired stopping and filter layers, the method then continues at step 106 by masking and etching the filter layer in select areas using a photolithographic process, with the stopping layer used to protect layers in the select areas. At step 108 the process continues by etching the stopping layer from the select areas and at step 110, when a final layer has not been removed, steps 106 and 108 are repeated with additional masking and etch processes to selectively remove layers as required to provide sets of individual filters with different target wavelengths.

In a specific example of implementation, each individual filter defined by the method of FIG. 13 is associated with a single pixel element. In another example, each individual filter is associated with a plurality of pixel elements. In yet another example, a plurality of filters is associated with a single pixel element.

As may be used herein, the terms "substantially" and "approximately" provide an industry-accepted tolerance for its corresponding term and/or relativity between items. For some industries, an industry-accepted tolerance is less than one percent and, for other industries, the industry-accepted tolerance is 10 percent or more. Other examples of industry-accepted tolerance range from less than one percent to fifty percent. Industry-accepted tolerances correspond to, but are not limited to, component values, integrated circuit process variations, temperature variations, rise and fall times, thermal noise, dimensions, signaling errors, dropped packets, temperatures, pressures, material compositions, and/or performance metrics. Within an industry, tolerance variances of accepted tolerances may be more or less than a percentage level (e.g., dimension tolerance of less than +/−1%). Some relativity between items may range from a difference of less than a percentage level to a few percent. Other relativity between items may range from a difference of a few percent to magnitude of differences.

As may also be used herein, the term(s) "configured to", "operably coupled to", "coupled to", and/or "coupling" includes direct coupling between items and/or indirect coupling between items via an intervening item (e.g., an item includes, but is not limited to, a component, an element, a circuit, and/or a module) where, for an example of indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to".

As may even further be used herein, the term "configured to", "operable to", "coupled to", or "operably coupled to" indicates that an item includes one or more of power connections, input(s), output(s), etc., to perform, when activated, one or more its corresponding functions and may further include inferred coupling to one or more other items. As may still further be used herein, the term "associated with", includes direct and/or indirect coupling of separate items and/or one item being embedded within another item.

As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1. As may be used herein, the term "compares unfavorably", indicates that a comparison between two or more items, signals, etc., fails to provide the desired relationship.

As may be used herein, one or more claims may include, in a specific form of this generic form, the phrase "at least one of a, b, and c" or of this generic form "at least one of a, b, or c", with more or less elements than "a", "b", and "c". In either phrasing, the phrases are to be interpreted identically. In particular, "at least one of a, b, and c" is equivalent to "at least one of a, b, or c" and shall mean a, b, and/or c. As an example, it means: "a" only, "b" only, "c" only, "a" and "b", "a" and "c", "b" and "c", and/or "a", "b", and "c".

As may also be used herein, the terms "processing module", "processing circuit", "processor", "processing circuitry", and/or "processing unit" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, processing circuitry, and/or processing unit may be, or further include, memory and/or an integrated memory element, which may be a single memory device, a plurality of memory devices, and/or embedded circuitry of another processing module, module, processing circuit, processing circuitry, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, processing circuitry, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, processing circuitry and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, processing circuitry and/or processing unit executes, hard coded and/or operational instructions corresponding to at least some of the steps and/or functions illustrated in one or more of the Figures. Such a memory device or memory element can be included in an article of manufacture.

One or more embodiments have been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claims. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality.

To the extent used, the flow diagram block boundaries and sequence could have been defined otherwise and still perform the certain significant functionality. Such alternate definitions of both functional building blocks and flow diagram blocks and sequences are thus within the scope and spirit of the claims. One of average skill in the art will also recognize that the functional building blocks, and other illustrative blocks, modules and components herein, can be implemented as illustrated or by discrete components, application specific integrated circuits, processors executing appropriate software and the like or any combination thereof.

In addition, a flow diagram may include a "start" and/or "continue" indication. The "start" and "continue" indications reflect that the steps presented can optionally be incorporated in or otherwise used in conjunction with one or more other routines. In addition, a flow diagram may include an "end" and/or "continue" indication. The "end" and/or "continue" indications reflect that the steps presented can end as described and shown or optionally be incorporated in or otherwise used in conjunction with one or more other routines. In this context, "start" indicates the beginning of the first step presented and may be preceded by other activities not specifically shown. Further, the "continue" indication reflects that the steps presented may be performed multiple times and/or may be succeeded by other activities not specifically shown. Further, while a flow diagram indicates a particular ordering of steps, other orderings are likewise possible provided that the principles of causality are maintained.

The one or more embodiments are used herein to illustrate one or more aspects, one or more features, one or more concepts, and/or one or more examples. A physical embodiment of an apparatus, an article of manufacture, a machine, and/or of a process may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

While transistors may be shown in one or more of the above-described figure(s) as field effect transistors (FETs), as one of ordinary skill in the art will appreciate, the transistors may be implemented using any type of transistor structure including, but not limited to, bipolar, metal oxide semiconductor field effect transistors (MOSFET), N-well transistors, P-well transistors, enhancement mode, depletion mode, and zero voltage threshold (VT) transistors.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

The term "module" is used in the description of one or more of the embodiments. A module implements one or more functions via a device such as a processor or other processing device or other hardware that may include or operate in association with a memory that stores operational instructions. A module may operate independently and/or in conjunction with software and/or firmware. As also used herein, a module may contain one or more sub-modules, each of which may be one or more modules.

As may further be used herein, a computer readable memory includes one or more memory elements. A memory element may be a separate memory device, multiple memory devices, or a set of memory locations within a memory device. Such a memory device may be a read-only memory, random access memory, volatile memory, non-volatile memory, static memory, dynamic memory, flash memory, cache memory, and/or any device that stores digital information. The memory device may be in a form a solid-state memory, a hard drive memory, cloud memory, thumb drive, server memory, computing device memory, and/or other physical medium for storing digital information.

As applicable, one or more functions associated with the methods and/or processes described herein can be implemented via a processing module that operates via the non-human "artificial" intelligence (AI) of a machine. Examples of such AI include machines that operate via anomaly detection techniques, decision trees, association rules, expert systems and other knowledge-based systems, computer vision models, artificial neural networks, convolutional neural networks, support vector machines (SVMs), Bayesian networks, genetic algorithms, feature learning, sparse dictionary learning, preference learning, deep learning and other machine learning techniques that are trained using training data via unsupervised, semi-supervised, supervised and/or reinforcement learning, and/or other AI. The human mind is not equipped to perform such AI techniques, not only due to the complexity of these techniques, but also due to the fact that artificial intelligence, by its very definition—requires "artificial" intelligence—i.e., machine/non-human intelligence.

As applicable, one or more functions associated with the methods and/or processes described herein can be implemented as a large-scale system that is operable to receive, transmit and/or process data on a large-scale. As used herein, a large-scale refers to a large number of data, such as one or more kilobytes, megabytes, gigabytes, terabytes or more of data that are received, transmitted and/or processed. Such receiving, transmitting and/or processing of data cannot practically be performed by the human mind on a large-scale within a reasonable period of time, such as within a second, a millisecond, microsecond, a real-time basis or other high speed required by the machines that generate the data, receive the data, convey the data, store the data and/or use the data.

As applicable, one or more functions associated with the methods and/or processes described herein can require data to be manipulated in different ways within overlapping time spans. The human mind is not equipped to perform such different data manipulations independently, contemporaneously, in parallel, and/or on a coordinated basis within a reasonable period of time, such as within a second, a millisecond, microsecond, a real-time basis or other high speed required by the machines that generate the data, receive the data, convey the data, store the data and/or use the data.

As applicable, one or more functions associated with the methods and/or processes described herein can be implemented in a system that is operable to electronically receive digital data via a wired or wireless communication network and/or to electronically transmit digital data via a wired or wireless communication network. Such receiving and transmitting cannot practically be performed by the human mind because the human mind is not equipped to electronically transmit or receive digital data, let alone to transmit and receive digital data via a wired or wireless communication network.

As applicable, one or more functions associated with the methods and/or processes described herein can be implemented in a system that is operable to electronically store digital data in a memory device. Such storage cannot practically be performed by the human mind because the human mind is not equipped to electronically store digital data.

While particular combinations of various functions and features of the one or more embodiments have been expressly described herein, other combinations of these features and functions are likewise possible. The present disclosure is not limited by the particular examples disclosed herein and expressly incorporates these other combinations.

What is claimed is:

1. A sensor system, comprising:
   a plurality of optical sensors implemented in a pixel layer of an integrated circuit; and
   a plurality of sets of optical filters spatially distributed on the pixel layer in a plurality of alternating filter layers, wherein each optical filter of a set of optical filters includes a plurality of filter components implemented in a stack and is configured to pass a respective target wavelength range of light to one or more optical sensors of the plurality of optical sensors, wherein a filter component of the plurality of filter components in a filter layer of the plurality of filter layers is common to a plurality of optical filters of a set of optical filters.

2. The sensor system of claim 1, wherein a filter component of the plurality of alternating filter components comprises a bottom surface of the optical filter.

3. The sensor system of claim 1, wherein the plurality of alternating filter layers includes one or more layers with a selectivity to one or more etch processes that is different from another layer of the plurality of alternating filter layers.

4. The sensor system of claim 3, wherein at least one of the one or more etch processes are selected from a list consisting of:
   reactive-ion etching (RIE);
   ion milling;
   inductive coupled plasma (ICP) etching;
   plasma etching; and
   wet chemical etching.

5. The sensor system of claim 1, wherein at least one layer of the one or more layers with a selectivity to one or more etch processes is selected from a list consisting of:
   a sacrificial layer;
   a layer resistant to one or more wet etchants; and
   a layer resistant to one or more plasma processes.

6. The sensor system of claim 1, wherein the target wavelength range of each optical filter of the set of optical filters is determined based on a combination of optical properties for the plurality of alternating filter layers.

7. The sensor system of claim 1, wherein the plurality of alternating filter layers includes one or more layers deposited using a process selected from a list consisting of:
   gas phase deposition
   chemical vapor deposition (CVD);
   a single layer deposition;
   a spin-on process;
   e-beam deposition
   sputtering;
   ion-beam sputtering
   reactive sputtering
   high-target-utilization sputtering;
   ion-assisted deposition;
   high-power impulse magnetron sputtering;
   gas flow sputtering, while single layer deposition techniques include
   molecular beam epitaxy (MBE);
   a Langmuir-Blodgett method;
   atomic layer deposition; and
   molecular layer deposition.

8. The sensor system of claim 1, wherein the plurality of alternating filter layers comprise one or more layers selected from a list consisting of:
   reflective material;
   a partially reflective glass optical flat;
   silicon oxide ($SiO_x$);
   titanium oxide ($TiO_x$); and
   niobium oxide ($Nb_xO_y$).

9. The sensor system of claim 1, wherein the set of optical filters comprises a plurality of Fabry-Perot filters, wherein one or more of the plurality of Fabry-Perot filters is manufactured with a filter component of at least some of the plurality of Fabry-Perot filters being deposited and defined in a same step.

10. The sensor system of claim 1, wherein a first filter layer of the plurality of alternating filter layers comprises a bottom surface of the optical filter, wherein a filter component of the first filter layer is configured to directly overlay the pixel layer, wherein the filter component of the first filter layer is configured to reject light wavelengths outside a range of optical wavelengths.

11. The sensor system of claim 1, wherein the set of optical filters comprises a plurality of Fabry-Perot filters, wherein at least some Fabry-Perot filters of the plurality of Fabry-Perot filters include a plurality of Bragg mirrors, wherein a common first and a common second portion of Bragg mirrors for different Fabry-Perot filters are deposited simultaneously.

12. The sensor system of claim 1, wherein the plurality of alternating layers comprises:
   a first layer, configured so that a bottom surface of the first layer overlays the pixel layer, wherein at least one filter component of the first layer is adapted to function as an etch stop;
   a second layer configured so that a bottom surface of the second layer overlays a portion of the top surface of the first layer;
   a third layer, configured so that a bottom surface of the third layer overlays the second layer, wherein at least one filter component of the third layer is adapted to function as an etch stop; and
   a fourth layer configured so that a bottom surface of the fourth layer overlays a portion of the top surface of the third layer.

13. The sensor system of claim 12, wherein the set of optical filters comprises a plurality of Fabry-Perot filters, wherein at least some of the Fabry-Perot filters include a cavity layer comprising the second layer, the third layer and the fourth layer.

14. The sensor system of claim 12, wherein the fourth layer is adapted to function as a mirror in a Bragg structure.

15. An imaging device, comprising:
   a plurality of optical sensors having a respective top surface and a respective bottom surface, the bottom surface of the plurality of optical sensors formed on an integrated circuit;
   a plurality of optical filter layers deposited severally on the plurality of optical sensors top surface, wherein the plurality of optical filter layers are further patterned using one or more photolithographic processes to provide a plurality of sets of optical filter stacks, each optical filter stack of the plurality of optical filter stacks including a set of optical filter layers of the plurality of optical filter layers, wherein each set of optical filter layers includes one or more layers adapted to provide an etch stop for the one or more photolithographic processes, wherein each optical filter stack of a set of optical filter stacks is configured to pass a respective target wavelength range of light to one or more optical sensors of the plurality of optical sensors and wherein each optical filter stack includes an optical layer common to one or more optical filter stacks of a set of optical filter stacks.

16. The imaging device of claim 15, wherein a photolithographic process of the one or more photolithographic processes includes a combination of one or more etch processes and one or more deposition processes.

17. The imaging device of claim 16, wherein the one or more layers adapted to provide an etch stop are adapted to be substantially inert to the one or more etch processes.

18. The imaging device of claim 16, wherein a component of the etch process is selected from a list consisting of:
   reactive-ion etching (RIE);
   ion milling;
   inductive coupled plasma (ICP) etching;
   plasma etching; and
   wet chemical etching.

19. The imaging device of claim 15, wherein the plurality of optical filter layers are selected from a list consisting of:
   a sacrificial layer;
   a layer resistant to one or more wet etchants; and
   a layer resistant to one or more plasma processes.

20. The imaging device of claim 15, wherein the plurality of optical filter layers include optical filter layers deposited using a process selected from a list consisting of
   gas phase deposition
   chemical vapor deposition (CVD);
   a single layer deposition;
   a spin-on process;
   e-beam deposition
   sputtering;
   ion-beam sputtering
   reactive sputtering
   high-target-utilization sputtering;
   ion-assisted deposition;
   high-power impulse magnetron sputtering;
   gas flow sputtering, while single layer deposition techniques include
   molecular beam epitaxy (MBE);
   a Langmuir-Blodgett method;
   atomic layer deposition; and
   molecular layer deposition.

21. The imaging device of claim 15, wherein the plurality of optical filter layers include optical filter layers deposited using a process selected from a list consisting of:
   reflective material;
   a partially reflective glass optical flat;
   silicon oxide ($SiO_x$);
   titanium oxide ($TiO_x$); and
   niobium oxide $Nb_xO_y$.

* * * * *